(12) United States Patent
Vogel et al.

(10) Patent No.: US 10,776,452 B2
(45) Date of Patent: Sep. 15, 2020

(54) METHOD AND DEVICE FOR DETERMINING STATISTICAL PROPERTIES OF RAW MEASURED VALUES

(71) Applicant: Robert Bosch GmbH, Stuttgart (DE)

(72) Inventors: Andreas Vogel, Hildesheim (DE); Kateryna Krykunova, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 204 days.

(21) Appl. No.: 15/532,158

(22) PCT Filed: Oct. 5, 2015

(86) PCT No.: PCT/EP2015/072896
§ 371 (c)(1),
(2) Date: Jun. 1, 2017

(87) PCT Pub. No.: WO2016/087087
PCT Pub. Date: Jun. 9, 2016

(65) Prior Publication Data
US 2017/0270076 A1    Sep. 21, 2017

(30) Foreign Application Priority Data

Dec. 4, 2014  (DE) .......................... 10 2014 224 911

(51) Int. Cl.
*G06F 17/18*  (2006.01)
*H03H 17/02*  (2006.01)
(Continued)

(52) U.S. Cl.
CPC .............. *G06F 17/18* (2013.01); *G01S 7/292* (2013.01); *G01S 7/354* (2013.01); *G01S 13/931* (2013.01);
(Continued)

(58) Field of Classification Search
CPC ........ G01S 13/931; G01S 19/13; G01S 19/45; G01S 19/47; G01S 7/292; G01S 7/354; G06F 17/18; H03H 17/0257
See application file for complete search history.

(56) References Cited

U.S. PATENT DOCUMENTS 5,999,567 A * 12/1999 Torkkola ............ H03H 21/0012
  375/232
6,542,914 B1 * 4/2003 Pupalaikis ......... G01R 13/0272
  708/300
(Continued)

FOREIGN PATENT DOCUMENTS

CN    104901637 A  *  9/2015
DE    4427656 C1    11/1995
EP    0784213 A2     7/1997

OTHER PUBLICATIONS

English machine translation of patent document, Li et al. (CN104901637A), generated by Google Patents. (Year: 2015).*
(Continued)

*Primary Examiner* — Roy Y Yi
*Assistant Examiner* — Geoffrey T Evans
(74) *Attorney, Agent, or Firm* — Norton Rose Fulbright US LLP; Gerard Messina

(57) ABSTRACT

In order to at least approximately determine statistical properties of raw measured values, e.g., measurement noise and/or average errors, without knowledge of a filter applied to raw measured values and only with the aid of a useful signal obtained from the filtering, i.e., in order to make statements regarding measurement conditions by assuming a few frequently encountered boundary conditions, statistical properties of raw measured values are determined from the useful signal, which is composed of a temporal sequence of filter output values. A filter characteristic of the filter is ascertained from the temporal sequence of output values obtained under stable measurement conditions, the ascertained filter characteristic is inverted, raw measured values are reconstructed from the inverse of the filter characteristic and from the useful signal, and the statistical properties are ascertained from the reconstructed raw measured values and/or from the inverse of the filter characteristic and from the useful signal.

15 Claims, 1 Drawing Sheet

(51) Int. Cl.
*G01S 19/47* (2010.01)
*G01S 13/931* (2020.01)
*G01S 19/45* (2010.01)
*G01S 19/13* (2010.01)
*G01S 7/35* (2006.01)
*G01S 7/292* (2006.01)

(52) U.S. Cl.
CPC .............. *G01S 19/13* (2013.01); *G01S 19/45* (2013.01); *G01S 19/47* (2013.01); *H03H 17/0257* (2013.01)

(56) References Cited

U.S. PATENT DOCUMENTS

| | | | | |
|---|---|---|---|---|
| 8,942,882 | B2* | 1/2015 | Swearingen | G08G 5/0021 701/29.1 |
| 2005/0088336 | A1* | 4/2005 | Sakamoto | G01S 7/038 342/175 |
| 2008/0015746 | A1* | 1/2008 | Bertazzoni | B63H 21/213 701/21 |
| 2011/0158363 | A1* | 6/2011 | Andersen | H03H 21/0012 375/350 |
| 2013/0162348 | A1* | 6/2013 | Bai | H03F 3/245 330/75 |
| 2013/0346017 | A1* | 12/2013 | Stephens | G01B 21/16 702/150 |
| 2014/0079407 | A1* | 3/2014 | Dou | H04L 25/03006 398/149 |
| 2014/0218226 | A1 | 8/2014 | Raz et al. | |
| 2016/0079961 | A1* | 3/2016 | Jin | G01R 23/02 708/300 |

OTHER PUBLICATIONS

International Search Report dated Dec. 15, 2015 of the corresponding International Application PCT/EP2015/072896 filed Oct. 5, 2015.
Fredrik Gustafson, "Adaptive Filtering and Change Detection," John Wiley & Sons, Ltd, 200, pp. 312.
Braasch et al: "A Signal Model for GPS," 1991, pp. 363-378, Navigation.
Kalman-Filter, wikipedia—http://de.wikipedia.org.

* cited by examiner

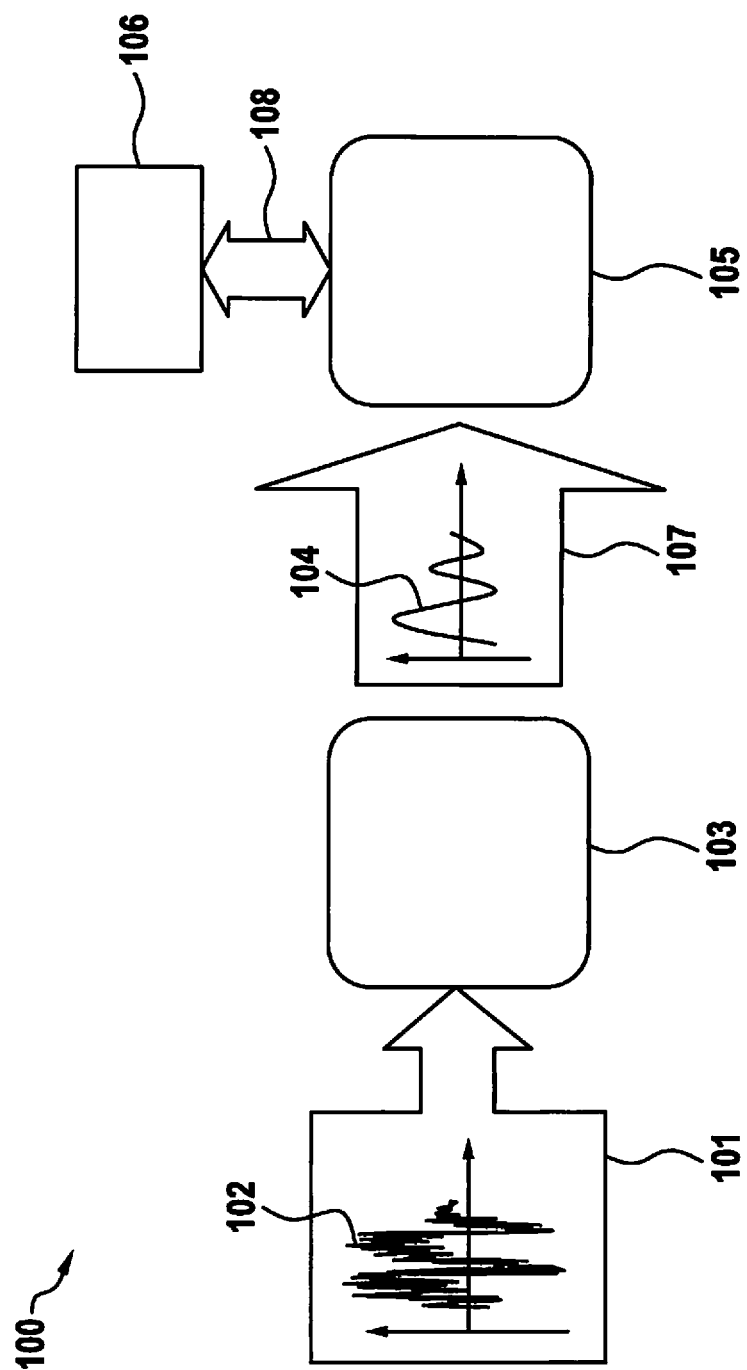

METHOD AND DEVICE FOR DETERMINING STATISTICAL PROPERTIES OF RAW MEASURED VALUES

CROSS-REFERENCE TO RELATED APPLICATIONS

The present application is the national stage of International Pat. App. No. PCT/EP2015/072896 filed Oct. 5, 2015, and claims priority under 35 U.S.C. § 119 to DE 10 2014 224 911.2, filed in the Federal Republic of Germany on Dec. 4, 2014, the content of each of which is incorporated herein by reference in its entirety.

BACKGROUND

Many technical systems are constructed from modules, and data signals containing information, i.e., data, are exchanged between the modules, i.e., transferred from one module to an adjacent module. These modules do not necessarily need to be located physically close together. Because transfer channels are limited in terms of their data rate, often only reduced information is transferred from one module into an adjacent module. One example thereof is a radar system of a device for a vehicle for automatic spacing control via radar ("ACC"). A large volume of measurement data is received by this radar system, but what is derived therefrom and transferred is only a current spacing from one or more preceding vehicles, and their relative speeds. All further information, for example how good the reception conditions were, is lost. This is, however, extremely important for further processing of the signals, i.e., data, especially for an estimate as to how trustworthy the signals are. Another example is position determination by way of satellite navigation systems, or "GNSS." Usually only a position is transferred from a GNSS module. How reliable the measurement of the position was, i.e., the quality of the reception conditions, is not evident from the position indication. This information is very important, however, for further processing of that position, e.g., for combination with other sensor signals.

In general, often only the results of a filtering operation and/or evaluation operation are available, without further information. A user often additionally requires statistical statements regarding the instantaneous, actual (i.e., real) measured data that existed as raw measured values, i.e., raw measured data, prior to the filtering operation. Variances of the measured values are often utilized for such statistical statements.

Reference will be made below to the theory of linear filters, in particular the Kalman filter theory, which relates to the filtering of raw measured values to yield a useful signal, ranging from very simple filters (e.g., low-pass filters) to Kalman filters that constitute optimum observers. The Kalman filter is a set of mathematical equations with which, when error-affected observations are present, conclusions are possible as to the state of many technical systems, as is evident from, for example, the Internet site of de.wikipedia.org/wiki/Kalman-Filter as presented in 2014. In simplified terms, the Kalman filter serves to remove interference caused by measurement devices. The mathematical structure both of an underlying dynamic system with which the measurements to be filtered are made, and of the measurement distortions, must be known.

It is known from the monograph by Fredrik Gustafson, "Adaptive Filtering and Change Detection," John Wiley & Sons, Ltd.; copyright 2000, ISBN 0-471-49287-6, page 312, that the measurement noise can be calculated from the filter result if the entire filter configuration, and complete information regarding the filter values and their statistical characteristics, in particular the variances, are known.

SUMMARY

An object of the invention is to at least approximately determine statistical properties of raw measured values, in particular measurement noise and/or average errors, without detailed knowledge of a filtering operation or filter for the raw measured values and only with the aid of output values of the filter, i.e., of a useful signal obtained from the raw measured values by way of the filtering operation, i.e., to make statements regarding the measurement conditions by assuming a few frequently encountered boundary conditions even without a knowledge of the exact filter.

According to an example embodiment, this object is achieved by a method for determining statistical properties of raw measured values from a useful signal that is obtained from a filtering operation in a filter and that is constituted from a temporal sequence of output values of the filter, where the method includes ascertaining a filter characteristic of the filter from a temporal sequence of output values obtained under stable measurement conditions, inverting the ascertained filter characteristic, reconstructing raw measured values from the inverse of the filter characteristic and from the useful signal, and ascertaining the statistical properties from the reconstructed raw measured values and/or directly from the inverse of the filter characteristic and from the useful signal.

According to an example embodiment, two parts of a method are as follows. The filter characteristic is learned at times of constant measurements. Once the filter behavior is known with sufficient accuracy, the unknown filter, i.e., its filter characteristic, can be inverted, and statements can thus be made regarding the measurement conditions. Second, the ascertainment of the statistical properties, i.e., a statistical property usually referred to as a "variance," can be accomplished, selectably either directly or via the reconstruction of the raw measured values. The invention makes it possible, even when the useful signal is transferred at a limited data rate permitting transfer only of reduced information, to furnish additional information regarding the raw measured values which cannot be transferred because of the limited data rate.

According to a preferred refinement of the method according to the present invention, a presence of stable measurement conditions is recognized from an evaluation of the temporal sequence of the output values. An evaluation only of the useful signal is therefore necessary.

In a further preferred embodiment of the method according to the present invention, a presence of stable measurement conditions is recognized from a temporal sequence of changing output values that are at least almost uniform, preferably at least almost constant over time, or at least almost consistent over time, in accordance with a system model on which the filter is based. Depending on the application, measurement conditions sufficiently stable for a determination of the filter characteristic can exist if the useful signal or its change over time is constant over time.

In a further advantageous embodiment of the method according to the present invention, a presence of stable measurement conditions is recognized from an evaluation of sensor signals of further sensor devices. In addition to a radar spacing measurement or a position determination by way of GNSS, for example, displacement sensors, acceleration sensors, and/or optical sensors can serve in a vehicle as such further sensor devices.

According to a preferred refinement of the method according to the present invention, the filtering operation is performed in accordance with a low-pass filtration. This represents a very simple application instance. According to another embodiment of the method according to the present invention, the filtering operation is performed in accordance with a Kalman filtration. It is thereby also possible to describe more complex filtering operations.

According to the present invention, the learning of the filter characteristics takes place in periods in which the measurement conditions are benign and stable, this depending on the respective application instance. In the above cases, for example, it is when, for example, a preceding vehicle is being followed at a spacing that is the same or is changing uniformly. In the context of position determination, it is, for example, constant travel without accelerations, etc. This state can be recognized on the basis of very uniform output values of the value or also on the basis of other measurements, for example observed via an optical camera, or measurement of an acceleration via an acceleration sensor, etc. For example, the measurement conditions do not change substantially while driving on an expressway or the like. If learning is applied to a vehicle, then based on the known fact that the predominant majority of all driving takes place, on average, in unaccelerated fashion and straight ahead, the learning operation can be allowed to proceed continuously. The result of the method is that on average, the correct average behavior, i.e., a long-term average of the filter characteristics, is learned. For the sake of completeness, an investigation should be made for each operation as to whether this averaging assumption is correct over long time periods.

The invention proceeds in particular from a linear filter. The system process can be assumed to be known. In the examples described above, that process is Newton's laws. The selection of the measurement principle is immaterial in this context; what is important is the physical principle of the development of the system state that is to be observed by way of the method. It is furthermore important that a filter be valid for the entire range of measurements, for example that a special filter is not needed, for example, for very low speeds or the like.

The object recited above is furthermore achieved by an apparatus for carrying out a method as described herein, encompassing a device for obtaining and/or delivering raw measured values, a filter for obtaining a useful signal from the raw measured values, and a useful signal processing unit having an evaluation unit for ascertaining a filter characteristic of the filter, reconstructing the raw measured values, and ascertaining statistical properties of the raw measured values. The device for obtaining and/or delivering raw measured values preferably encompasses at least one measurement device and/or at least one transfer device with which the raw measured values are delivered to the filter. Only the useful signal is transferred between the filter and the useful signal processing unit, at a data rate that is lower than a data rate of the raw measured values, preferably small with respect thereto.

The apparatus according to the present invention makes it possible in simple fashion to make statements, only from the useful signal and even without an exact knowledge of the filter, about the measurement conditions under which the raw measured values were obtained.

The object recited above is furthermore achieved by a computer program product having program parts for executing the method described; by a machine-readable, in particular computer-readable data structure, generated by such a method and/or by at least one such computer program product; and by a machine-readable, in particular computer-readable data medium, on which at least one such computer program product is recorded and/or stored, and/or on which at least one such data structure is kept on hand for retrieval.

An exemplifying embodiment of the invention will be described with reference to the single FIGURE of the drawings.

BRIEF DESCRIPTION OF THE DRAWINGS

The FIGURE is a schematic block diagram of an apparatus for carrying out a method according to an example embodiment of the present invention.

DETAILED DESCRIPTION

An apparatus 100 includes a device 101, for example including a spacing radar of vehicle, for obtaining and/or delivering raw measured values 102. A filter 103 serves to obtain a useful signal 104, e.g., a spacing signal, from raw measured values 102. Useful signal 104 is transferred, via a transfer channel 107 having a low data transfer rate, to a useful signal processing unit 105 that has an evaluation unit 106 for ascertaining a filter characteristic of filter 103, reconstructing raw measured values 102, and ascertaining statistical properties of raw measured values 102. A connection 108 serves for data traffic between useful signal processing unit 105 and evaluation unit 106.

The method according to the exemplifying embodiment will be described on the basis of the following designations and abbreviations:

| Designation/ Abbreviation | Description |
|---|---|
| E | Expected value of a random variable; obtained by integrating the random variable, multiplied by its density function, from −infinity to +infinity |
| Variance, e.g., Q, R, P, F | The variance of a random variable is equal to the square of its standard deviation, and is obtained by integrating the density function, multiplied by the square of the deviation of the random variable from the expected value, from −infinity to +infinity |
| A | Transition matrix, also referred to as a "model" |
| H | Measurement matrix |
| I | Unity matrix (i.e., only ones on the diagonal) |
| q; Q | System noise, with associated variance |
| v; R | Measurement noise, with associated variance |
| p; P | Error in system vector, i.e., difference between true and estimated value, with associated variance |
| z | Current measured value |
| ¯x/x | True/estimated value of the system vector or output value |
| $P_-$ | "−" indicates the value according to the prediction |
| $P_+$ | "+" designates the value at the end of a filter step. Values without + or − are always relative to the end of the filter step, i.e., +. Interference variables do not have a + or −. |
| K | Kalman filter return |
| d | Difference between filter result and filter prediction: $x_{n-1} - Ax_n$. This difference is the so-called "filter innovation." |
| F | Variance of the filter innovation, i.e., $F = E(d,d)$ |
| Statistical characteristics | The expected value and variance of a random value |
| Filter characteristic | In a low-pass filter this is the filter constant; in a Kalman filter it is the additional system noise that is to be determined |

| Designation/ Abbreviation | Description |
|---|---|
| Output value of a filter | Result of the calculations of the filter, i.e., the estimate x for the true value ⁻x |
| System position | Synonym for the output value of a filter in the case of a Kalman filter |
| System variance P | Variance of the difference between the true and estimated value, i.e., ⁻x − x. |

A system model in accordance with the following equations is assumed:

$$\bar{x}_{n+1} = A \cdot \bar{x}_n - q_{n+1}$$

$$z_n = H \cdot \bar{x}_n + v_n$$

The true value of the system vector is propagated using the transition matrix A, and a noise also occurs. A noise is also part of the current measured value. The noise is described as follows:

$$P = E(x - \bar{x}, x - \bar{x})$$

$$q \in N(0, Q)$$

$$v \in N(0, R)$$

where $N(0,Q)$ and $N(0,R)$ are the normal distribution with an expected value and a respective variance Q and R. Any value can always be expressed as the sum of the true value and the error value. The error values are not correlated with one another.

A system of this kind can be observed, for example, by way of a Kalman filter described by the formulas below, where $P_-$ is the value according to the prediction, $P_+$ the value after correction, and the superscript T for the variables $A^T$ and $H^T$ designates the transpose of the correspondingly characterized matrix:

$$x_- = A x_+$$

$$P_- = A P_+ A^T + Q$$

$$K = P_- H^T (H P_- H^T + R)^{-1}$$

$$x_+ = x_- + K(z - H x_-)$$

$$P_+ = (I - KH) P_-$$

A detailed derivation of the formulas for a simple low-pass filter is provided below. The principle therein is applicable to a Kalman filter, but is simply more mathematically demanding in that context. The formulas applicable to the low-pass filter are:

$$x_{n+1} = \lambda x_n + (1 - \lambda) z_{n+1}$$

$$P = E(x, x)$$

$$R = E(z, z)$$

P is the system variance, R the measurement noise, and $\lambda$ the filter constant.

In periods of a stabilized state it can be assumed that the measurement noise and also the covariance of the filter are approximately constant. The filter characteristic is learned using this assumption. What needs to be determined for this purpose is the filter constant for the low-pass filter, and the system noise for the Kalman filter.

If a constant, stabilized state exists, the system variance over the course of time can be measured from the output values of the filter:

$$P = E(x_n, x_n)$$

The variance of the filter innovation can be measured experimentally in exactly the same way:

$$F = E(x_{n+1} - x_n, x_{n+1} - x_n)$$

This filter innovation can be rewritten as:

$$F = E(x_{n+1} - x_n, x_{n+1} - x_n) =$$
$$E(\lambda x_x (1 - \lambda) z - x_n, \lambda x_n + (1 - \lambda) z - x_n) = (\lambda - 1)^2 (P + R)$$

Because a stabilized state exists, however, the following is also valid:

$$P = E(x_{n-1}, x_{n+1}) = E(\lambda x_n + (1-\lambda) z, \lambda x_n + (1-\lambda) z) = \lambda^2 P + (1-\lambda)^2 R$$

The following can be calculated:

$$P - F = \lambda^2 P + (1-\lambda)^2 R - (\lambda - 1)^2 (P + R) = 2\lambda - 1) P$$

The filter characteristic, i.e., the filter constant in the case of a low-pass filter, can thus be determined from the equation:

$$2(1 - \lambda) P = F$$

The filter constant can thus be calculated only with the aid of the output values, and with no knowledge of the measurement noise.

For a Kalman filter, the derivation is as follows:

$$d_{n+1} = x_{n+1} - A x_n \quad (1)$$
$$= A \bar{x}_n - q_{n+1} + (1 - KH)(A p_n + q_{n+1}) +$$
$$K v_{n+1} - A(\bar{x}_n + p_n)$$
$$+ K(v_{n+1}) - H(A p_n + q_{n+1}))$$

This yields:

$$F =$$
$$E(d_{n+1}, d_{n+1}) = E(K(v_{n+1} - H(A p_n + q_{n+1})), K(v_{n+1} - H(A p_n + q_{n+1}))) =$$
$$K(R + H(A P A^T + Q) H^T) K^T = KH(A P A^T + Q)$$

The formulas for the Kalman filter were used for the derivation. The variances F of the filter innovation and P of the error in the system vector are directly measurable. $P \approx const$ in the stabilized state, and the following equation $$P_+ = (I - KH) P_-$$

therefore yields:

$$P = (I - KH)(A P A^T + Q)$$

It follows from this that:

$$P = A P A^T + Q - F$$

Because P and F are measurable and the transition matrix A is known from the physical model, the variance Q of the system noise can therefore be determined.

In order to ascertain the measurement noise in the second method step according to the invention, in the example of the simple low-pass filter the noise of the raw measured values can be calculated from the difference of the filter values if the filter characteristics are known. With known values for $x_n$ and $x_{n+1}$ and a calculated $\lambda$, the raw measured values can be reconstructed from $$\lambda_{n+1}=\lambda x_n+(1-\lambda)z_{n+1}$$

as $$z_{n+1}=(\lambda_{n+1}-\lambda x_n)/(1-\lambda)$$

The statistical characteristics, i.e., the variances, etc. of the useful signal, i.e., of the output signal of the low-pass filter, are thus ascertainable.

With Kalman filters, the intensity with which the last system position and the current measurement are filtered depends on the respective covariances. If the system variance P is very large, the measured values will be relied upon more. If the measurements are unreliable, the physical system model on which the filter is based, i.e., the equation $$\bar{x}_{n+1}=A \cdot \bar{x}_n - q_{n+1}$$

of the system model, will be relied upon more. It is proposed according to the present invention to use the equation of the filter innovation d, which can be measured directly in each step, in order to invert the Kalman filter. The relevant equation (see formula (1) above) is:

$$d_{n+1}=K(v_{n+1}=H(Ap_n+q_{n+1}))$$

where $$K=P\_H^T(HP\_H^T+R)^{-1}$$

The random values v, p, q are to be selected here from the normal distributions N(0,R), N(0,P) and N(0,Q), P and Q being known. Only the variance R of the measurement noise v remains to be determined. A variety of numerical calculation methods, which are known in principle, can be utilized for this determination. The Monte Carlo method is recited as a preferred example of such a calculation method.

Two probable solutions for the variance R of the measurement noise v are typically obtained. Because the measurement noise, i.e., measurement error, v appears once in the numerator and once as an associated variance in the denominator, a kind of quadratic equation results with regard to v and R. A quadratic equation typically has two solutions. Which of the two is the correct one can be ascertained from a knowledge of whether, for example, the reception environment is good or bad. This knowledge, i.e., a corresponding signal, can be ascertained and transferred, e.g., by device 101 as a single additional information item and stored in a memory provided therefor, in particular a flag. The additional information item indicates only whether the actual measurement noise prior to the filtering operation is fairly good or fairly bad, and requires at most a negligibly low data rate for transfer. An at least largely exact quantitative statement regarding the measurement noise prior to the filtering operation can thus be made using the method proposed here.

The distinction between the two aforementioned solutions can also be illustrated as follows. If the filter result is very close to the expected value of the undistorted physical model, then either the measurement can be perfect and can accurately confirm the physical model, or the measurement conditions are so poor that the measurement in fact has no influence on the filter result. According to an example, a distinction is made between these extremes. Because the values of the measurement noise are known for both cases as solutions of the equation, as a rule it is easy to distinguish between the two solutions based on further heuristics.

The methods described above for processing the raw measured values, and the physical variables and signals derived therefrom, can be executed in simple and advantageous fashion in particular using digital signal processors.

What is claimed is:

1. A method for determining statistical properties of raw measured values of a sensor device of a system for mobile use, where an output signal of the sensor device is formed as a temporal sequence of output values of a filtering operation of a filter of the sensor device to which the raw measured values are applied, the method comprising:
   receiving, by a processing unit of the system, the output signal of the sensor device;
   identifying a presence of stable measurement conditions for the sensor device during operation of the system, wherein the identifying the presence of the stable measurement conditions includes at least one of: evaluating the temporal sequence of the output values of the sensor device, or evaluating sensor signals of at least one second sensor device other than the sensor device;
   in response to identifying the presence of the stable measurement conditions, ascertaining, by the processing unit, a filter characteristic of the filter from the temporal sequence of output values of the output signal obtained under the stable measurement conditions;
   inverting, by the processing unit, the ascertained filter characteristic;
   ascertaining, by the processing unit, the statistical properties of the raw measured values based on the inverted ascertained filter characteristic and the output signal; and
   controlling the system based on the output signal and the ascertained statistical properties.

2. The method of claim 1, wherein the ascertaining the statistical properties includes reconstructing the raw measured values based on the inverted ascertained filter characteristic and the output signal and determining the statistical properties based on the reconstructed raw measured values.

3. The method of claim 1, wherein the identifying the presence of the stable measurement conditions includes evaluating the temporal sequence of the output values.

4. The method of claim 1, wherein the identifying the presence of the stable measurement conditions includes identifying that the output values change at least almost uniformly in accordance with a system model on which the filter is based.

5. The method of claim 1, wherein the identifying the presence of the stable measurement conditions includes identifying that a change in the output values is at least almost constant or consistent over time in accordance with a system model on which the filter is based.

6. The method of claim 1, wherein the identifying the presence of the stable measurement conditions includes an evaluation of sensor signals of at least one second sensor device other than the sensor device.

7. The method of claim 1, wherein the filtering operation includes a low-pass filtration.

8. The method of claim 1, wherein the filtering operation includes a Kalman filtration.

9. The method of claim 1, wherein the sensor device is a radar device, the raw measured values are measured values of radar signals, and the output signal is a spacing signal indicating a spacing of the system to an object.

10. The method of claim 9, wherein the identifying the presence of the stable measurement conditions includes an evaluation of sensor signals of a second sensor device other than the radar device, the second sensor device including at least one of: a displacement sensor, an acceleration sensor, or an optical sensor.

11. The method of claim 1, wherein the sensor device is a satellite navigation device, the raw measured values are measured values of satellite signals, and the output signal is a position signal indicating a position of the system.

12. The method of claim 11, wherein the identifying the presence of the stable measurement conditions includes an evaluation of sensor signals of a second sensor device other than the satellite navigation device, the second sensor device including at least one of: a displacement sensor, an acceleration sensor, or an optical sensor.

13. The method of claim 1, wherein the filter characteristic at least partially defines the filter of the sensor device.

14. An apparatus comprising processing circuitry configured to:
   obtain a signal from a sensor device of a system for mobile use, the signal formed as a temporal sequence of output values of a filtering operation of the sensor device applied to raw measures values of the sensor device;
   identify a presence of stable measurement conditions for the sensor device during operation of the system, wherein the identifying the presence of the stable measurement conditions includes at least one of: evaluating the temporal sequence of the output values of the sensor device, or evaluating sensor signals of at least one second sensor device other than the sensor device;
   in response to identifying the presence of the stable measurement conditions, ascertain a filter characteristic of the filtering operation from the temporal sequence of output values obtained under the stable measurement conditions;
   invert the ascertained filter characteristic;
   ascertain statistical properties of the raw measured values based on the inverted ascertained filter characteristic and the output signal; and
   control the system based on the output signal and the ascertained statistical properties.

15. A non-transitory computer-readable medium on which are stored instructions that are executable by a processor and that, when executed by the processor, cause the processor to perform a method for determining statistical properties of raw measured values of a sensor device of a system for mobile use, where an output signal of the sensor device is formed as a temporal sequence of output values of a filtering operation of a filter of the sensor device to which the raw measured values are applied, the method comprising:
   receiving, by a processing unit of the system, the output signal of the sensor device;
   identifying a presence of stable measurement conditions for the sensor device during operation of the system, wherein the identifying the presence of the stable measurement conditions includes at least one of: evaluating the temporal sequence of the output values of the sensor device, or evaluating sensor signals of at least one second sensor device other than the sensor device;
   in response to identifying the presence of the stable measurement conditions, ascertaining a filter characteristic of the filter from the temporal sequence of output values of the output signal obtained under the stable measurement conditions;
   inverting the ascertained filter characteristic;
   ascertaining the statistical properties of the raw measured values based on the inverted ascertained filter characteristic and the output signal; and
   controlling the system based on the output signal and the ascertained statistical properties.

* * * * *